(12) United States Patent
Or-Bach et al.

(10) Patent No.: US 7,550,996 B2
(45) Date of Patent: *Jun. 23, 2009

(54) STRUCTURED INTEGRATED CIRCUIT DEVICE

(75) Inventors: Zvi Or-Bach, San Jose, CA (US); Petrica Avram, Iasi (RO); Romeo Iacobut, Iasi (RO); Adrian Apostol, Iasi (RO); Ze'ev Wurman, Palo Alto, CA (US); Adam Levinthal, Redwood City, CA (US); Richard Zeman, San Jose, CA (US)

(73) Assignee: Easic Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/366,528

(22) Filed: Mar. 3, 2006

(65) Prior Publication Data

US 2006/0164121 A1 Jul. 27, 2006

Related U.S. Application Data

(63) Continuation of application No. 10/899,020, filed on Jul. 27, 2004, now Pat. No. 7,098,691.

(51) Int. Cl.
*G06F 7/38* (2006.01)
*H03K 19/177* (2006.01)

(52) U.S. Cl. .......................... 326/39; 326/41; 326/101

(58) Field of Classification Search ............. 326/38–41, 326/47, 101
See application file for complete search history.

(56) References Cited

U.S. PATENT DOCUMENTS

| 5,991,908 A * | 11/1999 | Baxter et al. ................. 714/727 |
| 6,194,912 B1 | 2/2001 | Or-Bach et al. |
| 6,236,229 B1 | 5/2001 | Or-Bach |
| 6,242,767 B1 * | 6/2001 | How et al. .................. 257/202 |
| 6,245,634 B1 | 6/2001 | Or-Bach |
| 6,331,733 B1 | 12/2001 | Or-Bach |
| 6,427,222 B1 | 7/2002 | Shau |
| 6,580,289 B2 | 6/2003 | Cox |
| 6,693,454 B2 | 2/2004 | Cox |
| 6,798,239 B2 | 9/2004 | Douglass et al. |
| 6,873,185 B2 * | 3/2005 | Cox ........................... 326/47 |
| 2003/0214322 A1 | 11/2003 | Cox |
| 2003/0234666 A1 | 12/2003 | Cox |

* cited by examiner

*Primary Examiner*—Anh Q Tran
(74) *Attorney, Agent, or Firm*—Connolly Bove Lodge & Hutz LLP

(57) ABSTRACT

A configurable logic array may include: a multiplicity of logic cells, containing look-up tables; customizable metal and via connection layers overlying the multiplicity of logic cells; a multiplicity of device customizable I/O cells; a multiplicity of configuration customizable RAM blocks; a ROM block with customizable contents; and/or a microprocessor with customizable I/O, which may be used for configuring and testing the array, where the customizations are all done on a single via layer.

24 Claims, 15 Drawing Sheets

FIGURE 11

STRUCTURED INTEGRATED CIRCUIT DEVICE

CROSS-REFERENCE TO RELATED APPLICATION

This application is a continuation of U.S. patent application Ser. No. 10/899,020, entitled "Structured Integrated Circuit Device," filed on Jul. 27, 2004, commonly assigned, and incorporated herein by reference in its entirety.

FIELD OF THE INVENTION

The present invention relates to integrated circuit devices as well as to methods for personalizing, programming and testing such devices.

BACKGROUND OF THE INVENTION

The following U.S. patents are believed to represent the current state of the art: U.S. Pat. Nos. 6,331,733, 6,245,634, 6,236,229, and 6,194,912. These patents all relate to prior art with respect to the current patent.

The above patents describe semiconductor devices, which contain logic cells that further contain look up tables and interconnects, which may be patterned by a single via mask. The advantages of such ASICs have been clearly defined in the prior art, but are limited to logical functions. Today, most semiconductor devices are comprised of random access memory, read only memory and processors, in addition to general combinatorial logic.

It is common to provide such components in a user configurable form within libraries, from which the designer must select and define their specific configuration, prior to instantiating the structure in their design. Typically these structures are implemented out of custom designed transistors and metal interconnects that require a full set of masks to fabricate. This is acceptable for Standard Cell technology, which also requires a full set of masks for the rest of the design, but can pose a problem for Structured ASIC parts, which do not.

On the other hand, FPGAs are devices that are completely programmable at the customer's site. In general RAMs, ROMs and processors, if available on FPGAs, have limited configuration options, which consist of reprogramming the interconnects between appropriate subfunctions. This is costly in both space and performance of the components.

The current invention provides a set of configurable components, many of which may reside together on one semiconductor device, and are configurable by a single via change, the same customization as is done for the rest of the design, resulting in either considerable performance and space advantages over FPGAs or significant reduction in the number of required masks compared with Standard Cell solutions.

SUMMARY OF THE INVENTION

The present invention seeks to provide an improved integrated circuit, which, in addition to the teachings of the prior art, is personalizable, programmable and testable.

There is thus provided in accordance with a preferred embodiment of the present invention a semiconductor device comprising:

a logic array including a multiplicity of logic cells, each logic cell comprising at least one look-up table, metal and via connection layers overlying the multiplicity of logic cells for providing at least one permanent customized interconnect between various inputs and outputs thereof; wherein the customized interconnect is customized by custom via layer; and also comprising multiplicity of device customized I/O cell wherein the customized I/O cell are customized by the custom via layer.

The device may further comprise a configurable RAM block and wherein the RAM block configuration is customized by the custom via layer.

It may also comprise a built-in microprocessor wherein the microprocessor has the ability to access the RAM block by a separate read/write port from the configurable RAM port, wherein the configurable RAM port also include via options for wired or logic multiplexing output of multiple RAMs.

It may also comprise a configurable ROM block and wherein the ROM block content is customized by the custom via layer.

It may also comprise a customizable clocks distribution structure and wherein the customizable clocks distribution structure is customized by the custom via layer, and further comprise a customizable trimmer cell to fine tune the clocks distribution structure and wherein the customizable trimmer cell is customized by the custom via layer There is additionally provided in accordance with a preferred embodiment of the present invention, a semiconductor device comprising:

a logic array including a multiplicity of logic cells, each logic cell comprising at least one look-up table, metal connection layers overlying the multiplicity of logic cells for providing at least one permanent customized interconnect between various inputs and outputs thereof;

and a built-in microprocessor, and further comprising a configurable ROM block, wherein the microprocessor has the ability to load or to read the content of the look-up table, and the microprocessor has the ability to perform test of the logic array, and also comprising a configurable RAM block and wherein the microprocessor has the ability to perform test of the RAM block.

There is additionally provided in accordance with a preferred embodiment of the present invention, a semiconductor device comprising:

a logic array comprising a multiplicity of logic cells, each logic cell including at least one flip-flop; and a metal connection layers overlying the multiplicity of identical logic cells for providing at least one permanent customized interconnect between various inputs and outputs thereof; wherein the customized interconnect is customized by custom via layer; and also comprising multiplicity of device customized I/O cell wherein the customized I/O cell are customized by the custom via layer, also comprising a configurable RAM block and wherein the RAM block configuration is customized by the custom via layer, also comprising a configurable ROM block and wherein the ROM block content is customized by the custom via layer, also comprising a customizable clocks distribution structure and wherein the customizable clocks distribution structure is customized by the custom via layer, and wherein the customizable clocks distribution structure contains constant loading at each stage of the distribution to maintain a pre-characterized delay regardless the customization by the custom via layer, which is also comprising a customizable trimmer cell to fine tune the clocks distribution structure and wherein the customizable trimmer cell is customized by the custom via layer.

There is additionally provided in accordance with a preferred embodiment of the present invention a semiconductor device wherein the I/O comprise a dedicated row of pads and wherein the dedicated row of pads are dedicated to provide power connection for the customized I/O cell, and wherein the dedicated row of pads can provide power connection to the logic array, and wherein the dedicated row of pads is the outer row of pads, or the dedicated row of pads is the third row of pads, and wherein the dedicated row of pads has no connection to an I/O cell input or output signals.

There is additionally provided in accordance with a preferred embodiment of the present invention a logic array comprising;

a multiplicity of identical logic cells, each identical logic cell comprising at least one look-up table, metal connection layers overlying the multiplicity of identical logic cells for providing at least one permanent customized direct interconnect between various inputs and outputs thereof, the logic array being designed such that the functionality of the multiplicity of identical logic cells is one of a number of functions determined by the configuration of the look-up tables.

There is additionally provided in accordance with a preferred embodiment of the present invention a semiconductor device comprising:

a multiplicity of functional blocks, at least one of the functional blocks being a configurable ROM block, wherein the contents of the ROM block is customized by a custom via layer, and at least one of the functional blocks being a configurable RAM block, wherein the configuration of the RAM block is customized by a custom via layer;

a multiplicity of metal connection layers overlying the multiplicity of blocks, for providing at least one permanent customized interconnect between various inputs and outputs of the multiplicity of blocks, wherein the customized interconnect is customized by the custom via layer; and a multiplicity of device customized I/O cells wherein the customized I/O cells are customized by the custom via layer, wherein the custom via layer is produced by wafer exposure directly from electronic data of the custom via layer.

BRIEF DESCRIPTION OF THE DRAWINGS

The present invention will be understood and appreciated more fully from the following detailed description, taken in conjunction with the drawings in which:

FIG. 11 is an illustration of the addressing of blocks within a semiconductor device in FIG. 1.

DETAILED DESCRIPTION OF VARIOUS EMBODIMENTS

Figure 1:
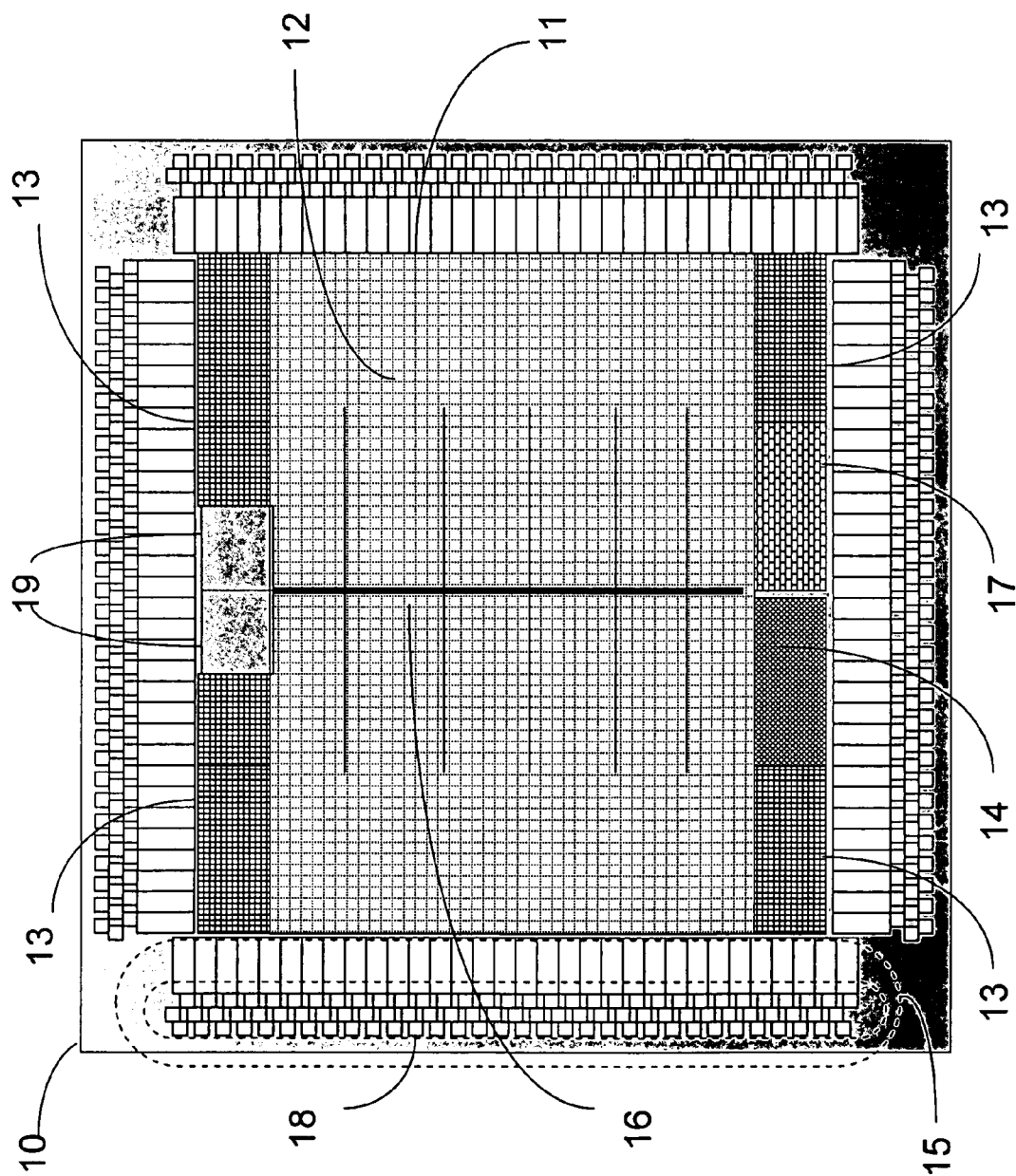
FIG. 1 is a simplified illustration of a semiconductor device containing a multiplicity of logic cells, RAM blocks, ROM blocks, IO cells, and a clock distribution structure.

Reference is now made to FIG. 1, which is a simplified illustration of a personalizable and programmable integrated circuit device constructed and operative in accordance with a preferred embodiment of the present invention. The integrated circuit device 10 of FIG. 1 consists of a logic array 11 comprised of a multiplicity of logic cells 12 with metal connection layers, a multiplicity of configurable RAM blocks 13, a configurable ROM block 14, clock phase lock loops 19, which drive a configurable clock distribution structure 16, a built-in microprocessor 17 and a multiplicity of configurable I/O cells 15, each with associated I/O pads 18. It is further contemplated that a varying number and size of such devices may reside on many such semiconductor devices.

Figure 2:
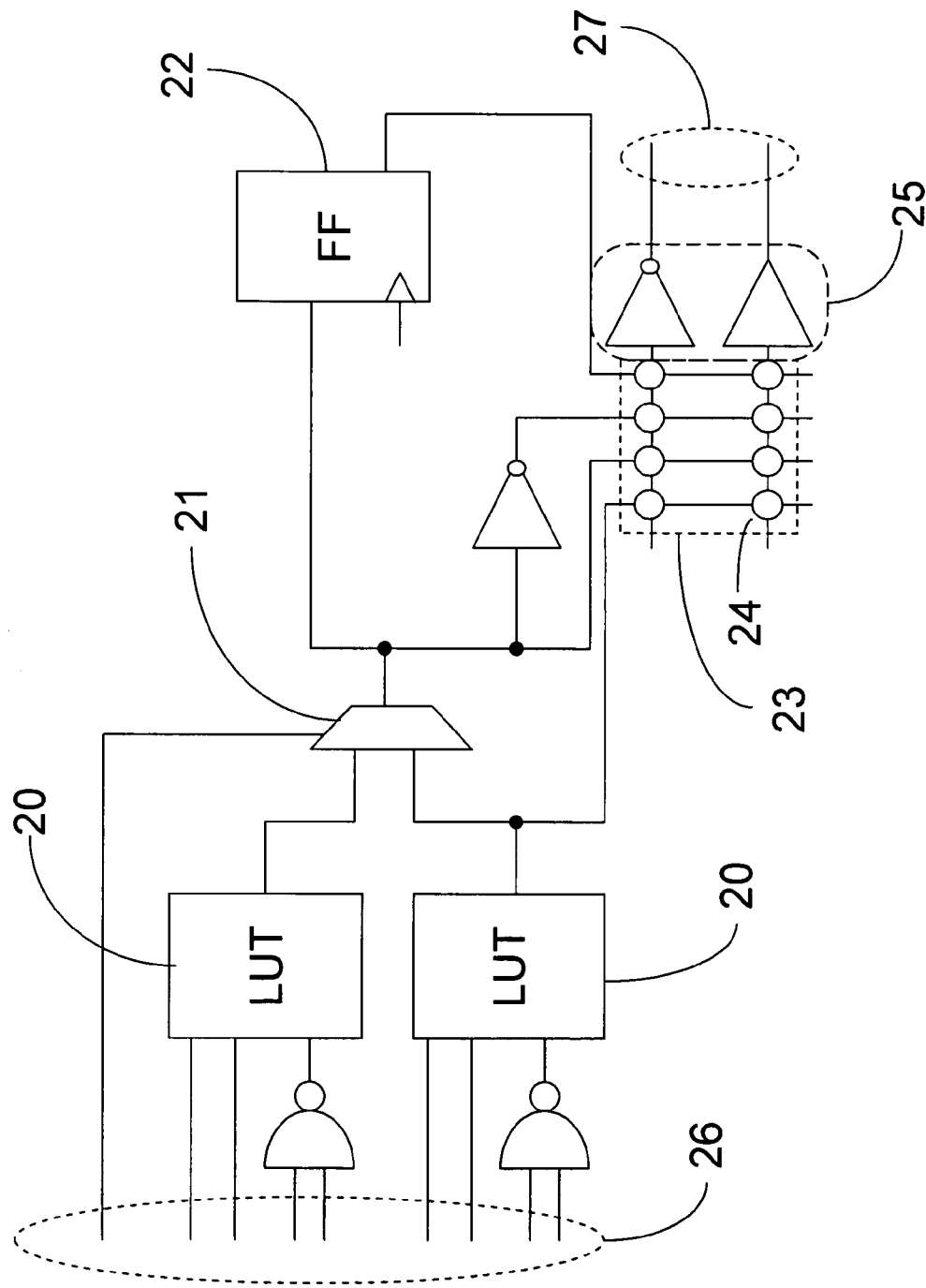
FIG. 2 is a simplified illustration of a logic cell within FIG. 1, including a flip-flop and multiple look up tables in accordance with a preferred embodiment of the present invention.
Figure 3:
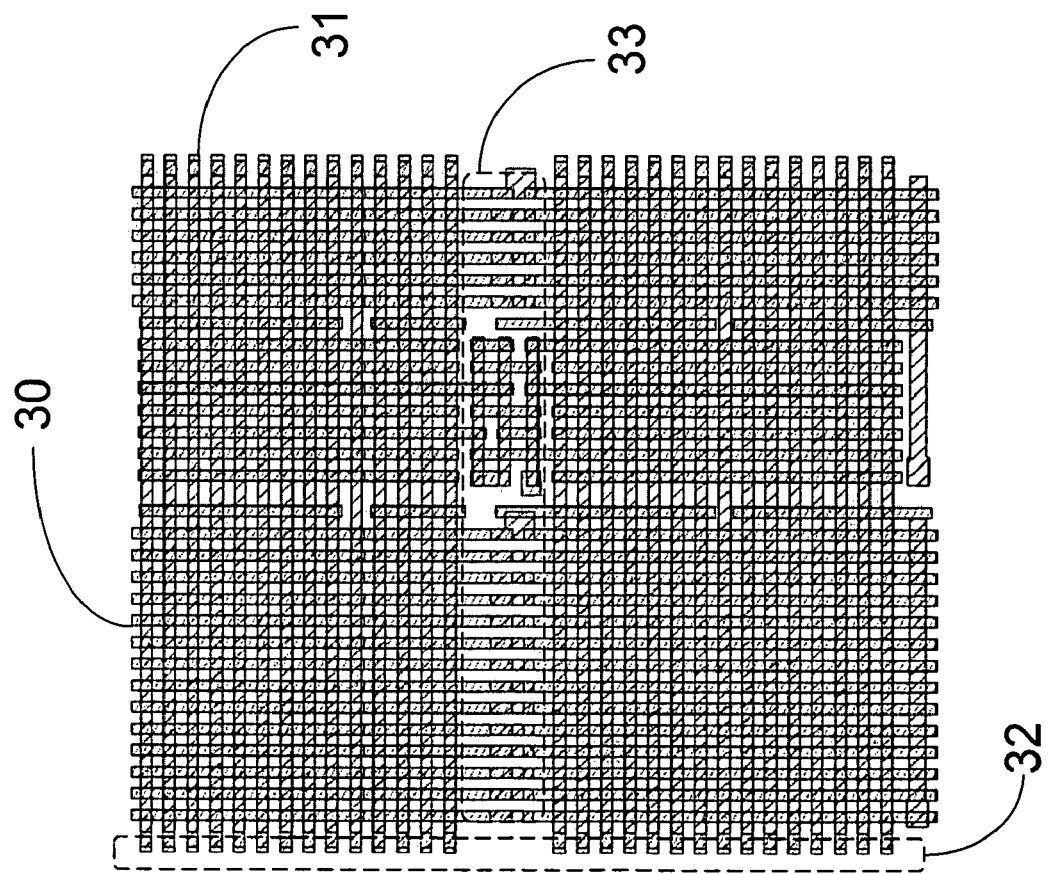
FIG. 3 is an illustration of the wiring layers for providing permanent programmable interconnect between the logic cells illustrated in FIG. 2.

Reference is now made to FIG. 2, which is a more detailed illustration of a logic cell, as previously described in U.S. Pat. No. 6,642,744 Or-Bach et al. The logic cells are preferably comprised of two look-up-tables 20, connected through a multiplexor 21 to a flip-flop 22. Preferably there are also a set 23 of positions 24 for selectively placing vias to connect various wires within the logic cell to preferably one of two output buffers 25. Preferably the logic cell inputs 26 and outputs 27 may be connected to the metal layers with a set of vias not shown. It is further contemplated that other combinations of the components shown in FIG. 2 may also be used in logic cells, Reference is now made to FIG. 3, which is a detailed illustration of the metal and via configuration layers, again as previously described in U.S. Pat. No. 6,642,744 Or-Bach, et al. One or more metal layers are preferably in the vertical direction 30, alternating with one or more metal layers that are preferably in the horizontal direction 31. Furthermore, there are locations 32 where selective connection between segments in the horizontal layer may be completed by use of selective placement of vias on the via connection layer up to jumper segments on a vertical layer, and locations 33 where selective connection between vertical segments may be completed by use of selective placement of vias on the via connection layer down to jumper segments on a horizontal layer. Furthermore, it is contemplated in the prior art that multiple vertical and horizontal layers can be connected by selective placement of vias on a single via connection layer.

Figure 4:
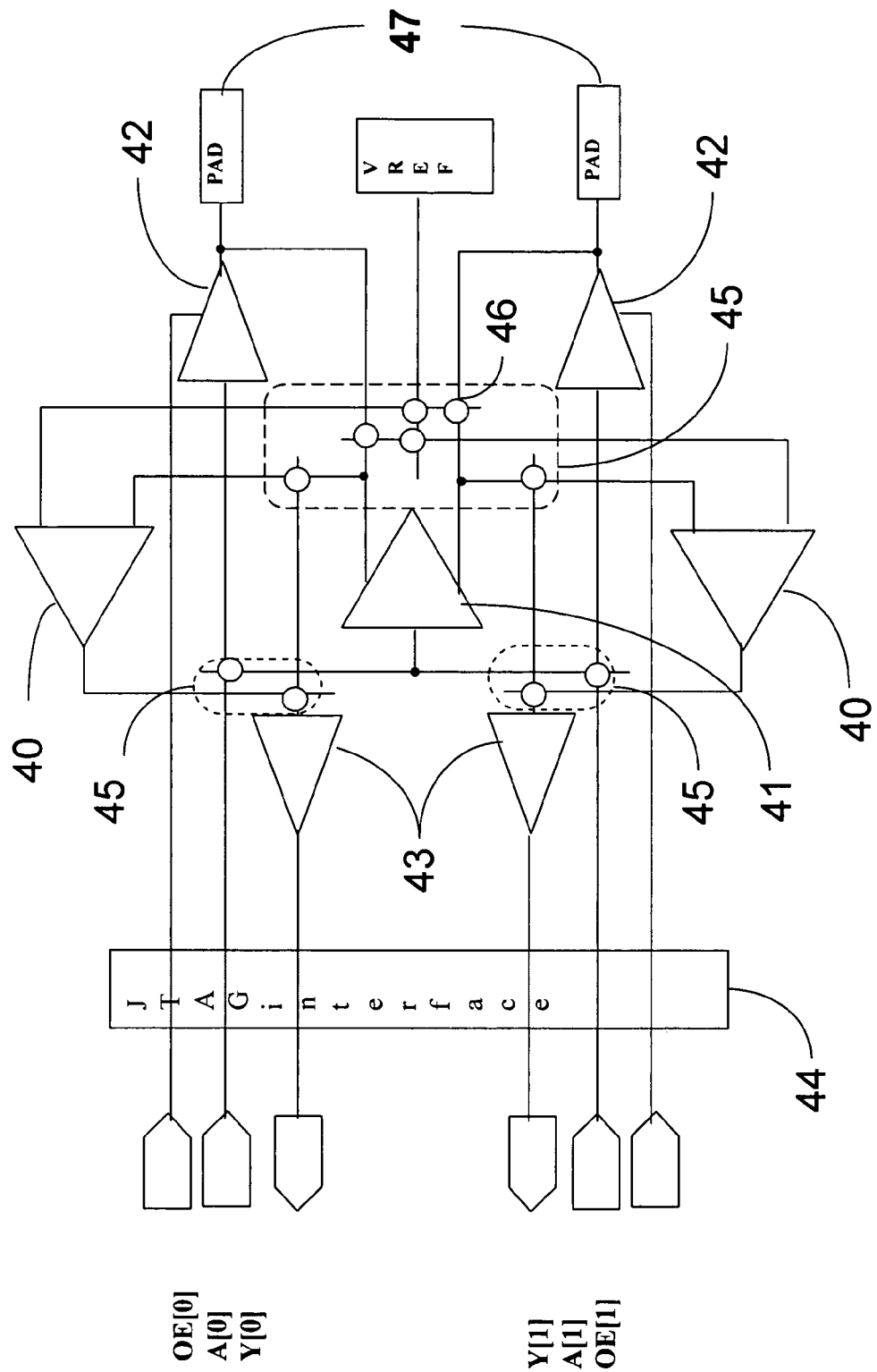
FIG. 4 is an illustration of the circuitry of an I/O cell including single via layer personalization.

Reference is now made to FIG. 4, which is a detailed illustration of a single I/O cell, a multiplicity of which are shown in FIG. 1, reference numeral 15, The I/O cells consist of differential receivers 40, an analog driver 41, tristate buffers 42, input buffers 43, and boundary scan JTAG 44, configurable into many different types of input, output and bi-directional I/O buffers commonly used in the industry. This configuration is accomplished by connecting a fixed set of metal segments with the selective placement of vias, an example of which is shown in FIG. 4, reference numeral 46, within the designated locations 45 within the I/O cell. Preferentially, the via layer to configure the I/O cell is the same via layer used to configure the logic array.

Figure 5:
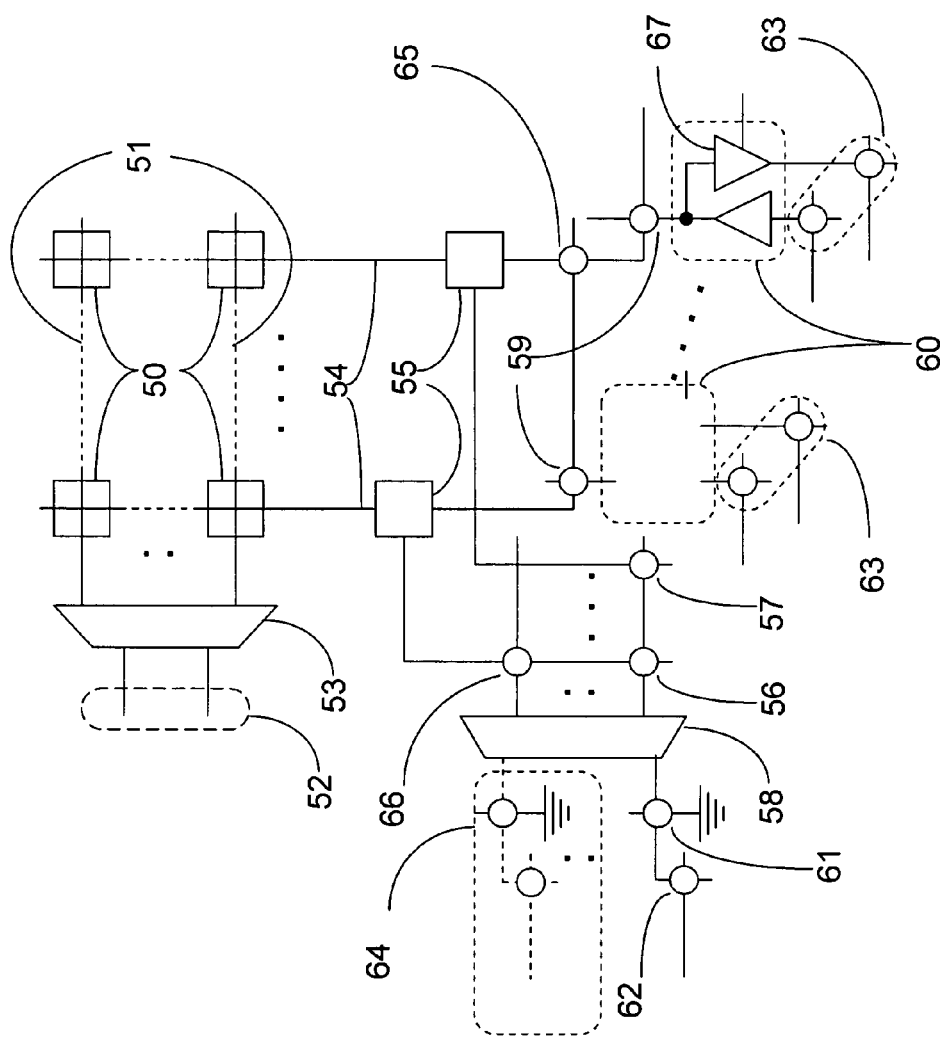
FIG. 5 is an illustration of a RAM block, including single via layer personalization.

Reference is now made to FIG. 5, which is a detailed illustration of a RAM Block, a multiplicity of which are placed on the circuit. Each RAM Block is comprised of a multiplicity of RAM cells 50 in rows and columns. Each row of RAM cells is selected by a word line 51 enabled by an address on a set of address lines 52 decoded by an address decoder 53. The accessed cells transfer data to or receive data from bit lines 54 observed and/or driven by sense amplifier logic 55. Each RAM Block can be configured to read or write a variety of widths of I/O by connecting a set of fixed metal segments via selective placement of vias.

For example, if two bits of output are desired, via locations 56 & 57 are selected to connect both the column's sense amp logic 55 to address 0 of the column decode 58. The via locations 59 connecting each column's sense amp logic to their I/O buffers 60 are also selected. Lastly, the via location 61 grounding the input to the column address logic 58 to select the proper decoded address the via locations 63 connecting the external logic to both I/O buffers are selected. On the other hand, if only one I/O buffer is desired, the memory can still be completely used by selecting part of the via locations 63 to connect external signals to only one of the I/O buffers, selecting the via location 62 to connect the external logic to the column address line, selecting via locations 56 & 66 to connect each column's sense amp logic to it's own column address line, and selecting a via location 65 to tie together both columns' set of sense amp logic. In this fashion, both columns are separately addressed to read or write data through the single selected I/O logic. In both cases, the vias are preferentially on the via layer used to configure the logic array.

Though the examples only describe selection between two columns of memory cells, a preferential embodiment includes $2^{N+1}$ columns of memory cells, which are optionally addressable by N additional column address lines 64.

Figure 6:
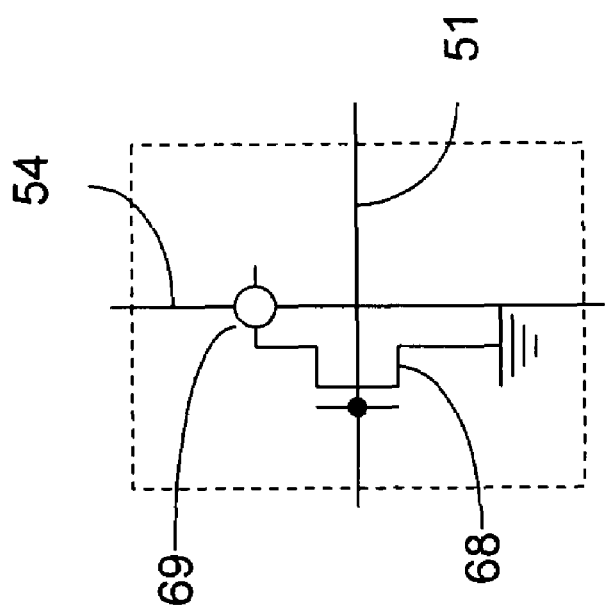
FIG. 6 is an illustration of a bit cell for a ROM block.

In one preferred embodiment, a configurable ROM block can be constructed in a manner similar to the RAM Block illustrated in FIG. 5. In such a preferred embodiment, the bit cells 50 are illustrated in greater detail in FIG. 6. Each ROM bit cell contains a transistor 68 whose source is grounded, gate is tied to its word line 51 and drain is selectively connected to its column's bit line by a via 69, preferably a via on the via layer used to configure the logic array. Furthermore, the sense amp logic 54 need only be a tristate output, not bi-directional, and the I/O logic 60 will only include the output buffer 67, as shown in FIG. 5.

Figure 7:
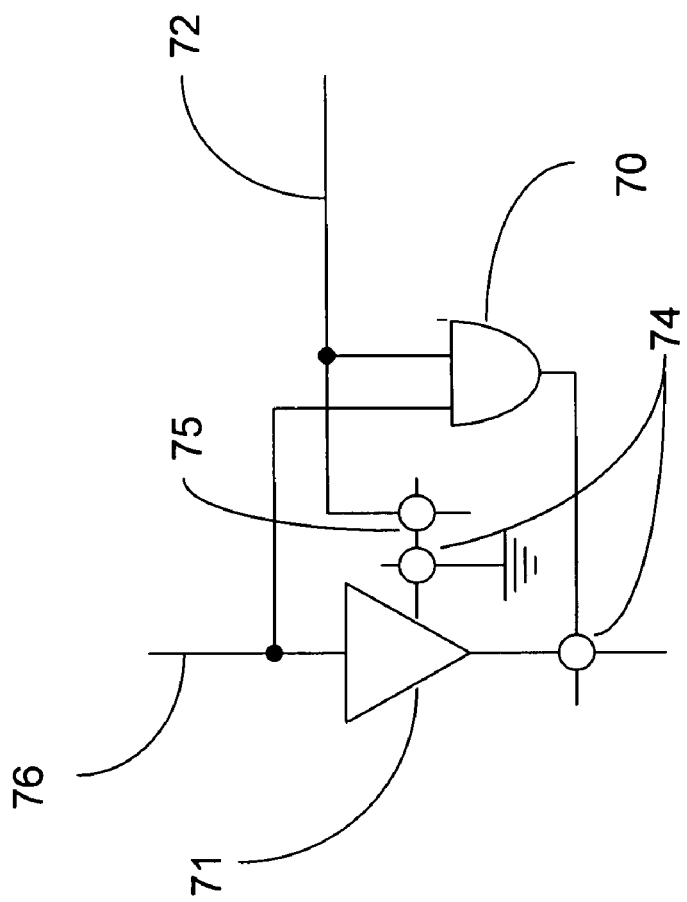
FIG. 7 is an illustration of an output buffer for a ROM or RAM block.

The RAM block or ROM block output buffer 67 shown in FIG. 5, is expanded in FIG. 7. In this preferred embodiment, both an AND gate 70 and a tristate buffer 71 are driven by the data line 76 and the enable line 72. The AND gate can be selected by tying off the tristate and connecting the AND gate to the output. This is accomplished by placing vias in the selected via locations 74. Alternatively the tristates can be selected by connecting the enable line to the tristate enable input by placing a via in the proper location 75 to connect them. This selection allows either multiple outputs to be correspondingly connected together with an OR function, or wired together. In both cases, the vias are preferentially on the via layer used to configure the logic array.

Figure 8:
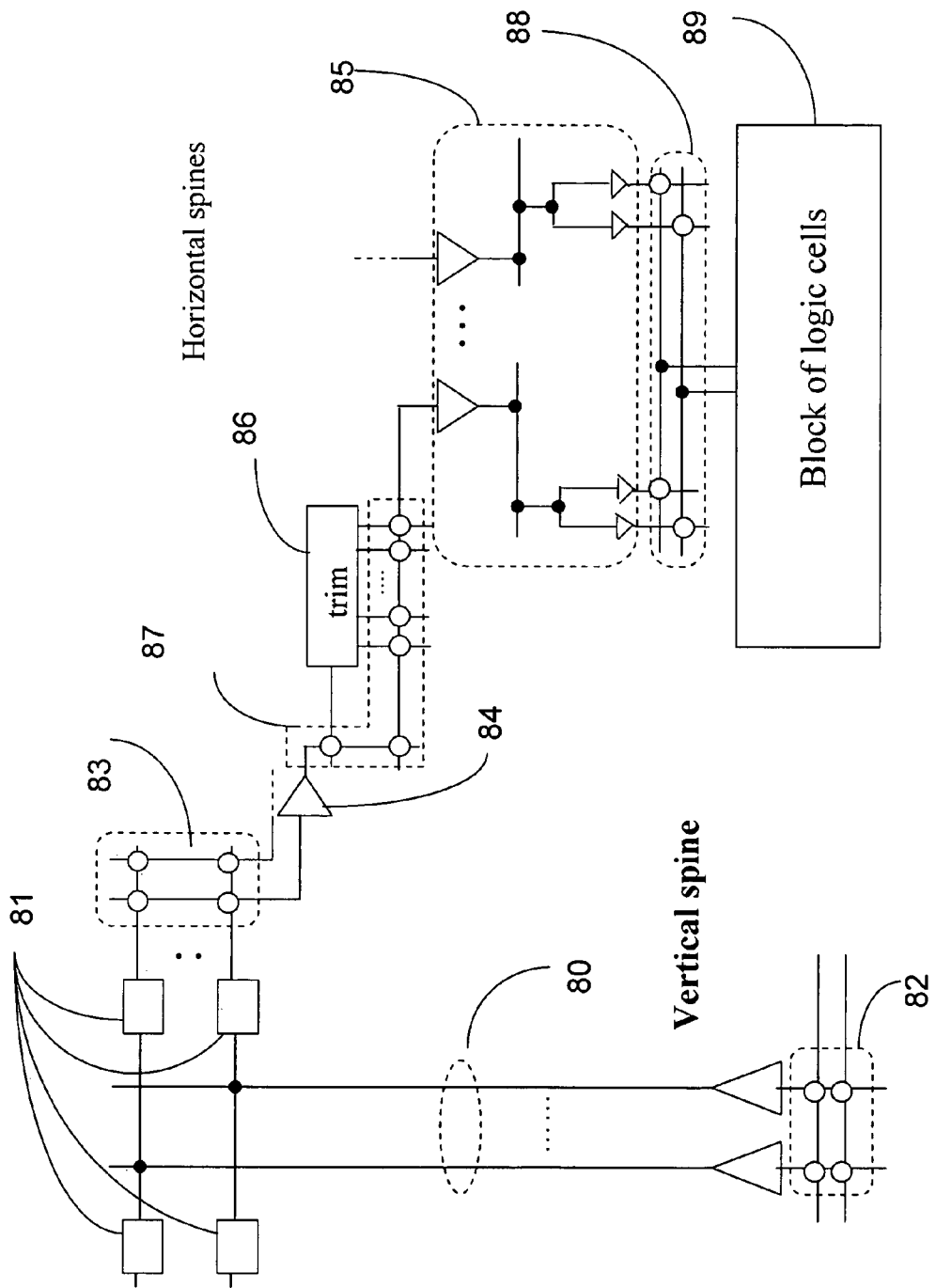
FIG. 8 is an illustration of a section of the clock distribution structure shown in FIG. 1.
Figure 9:
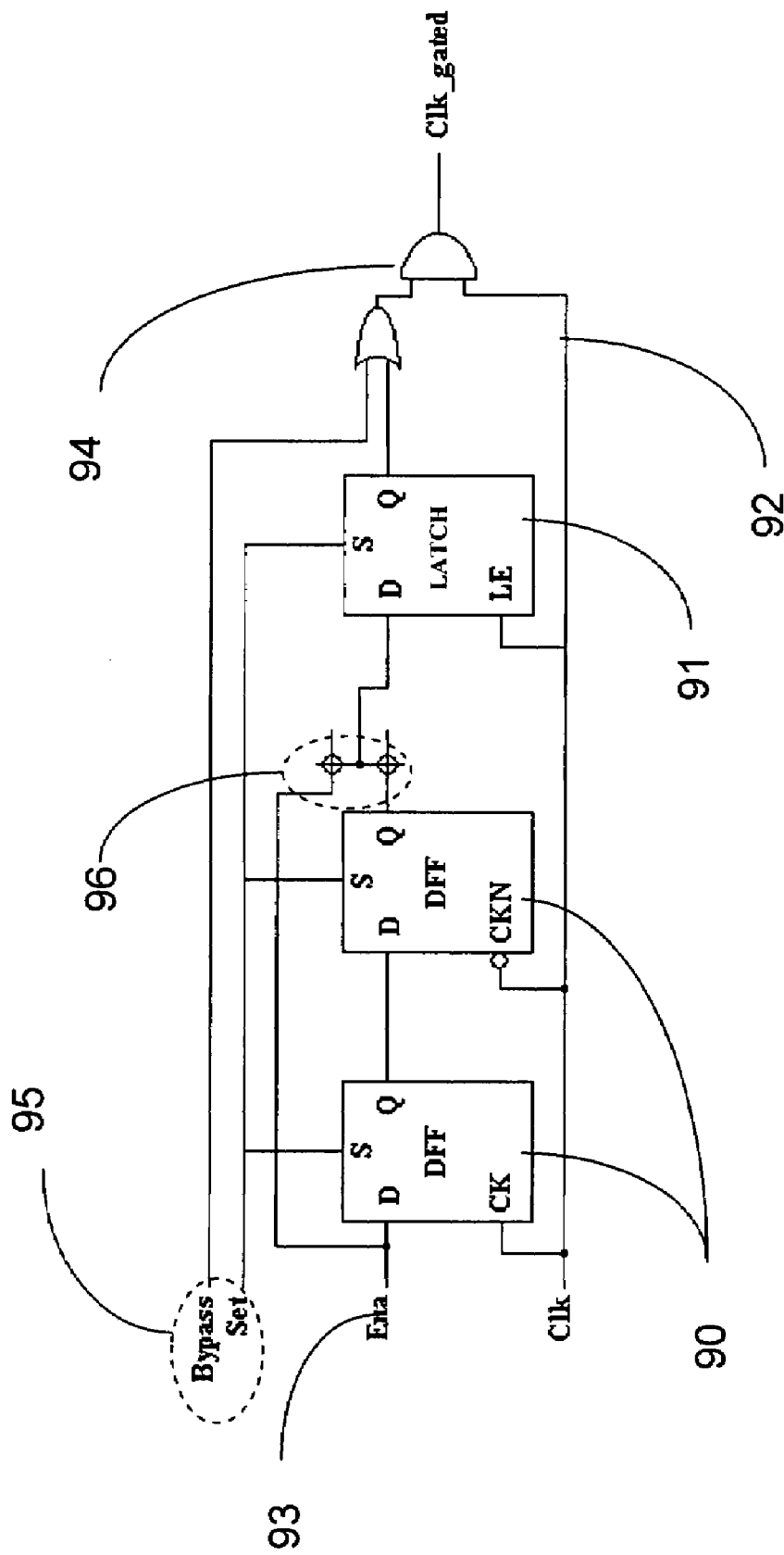
FIG. 9 is an illustration of a clock enable, within the clock distribution structure shown in FIG. 8.

Reference is now made to FIG. 8, which is a detailed diagram of a portion of the configurable clock distribution structure shown in FIG. 1. The first level of clock distribution is a multiplicity of Vertical Spines 80, driven either from an Input buffer or from a PLL, which is driven by an input buffer, by setting the appropriate via on one of the via locations 82. Preferably the PLL has the ability to set the frequency and phase of the clock between a set of defined alternatives. In one preferred embodiment there are 32 Vertical Spines. Each Vertical spine drives a multiplicity of identical enable buffers 81, preferably one for each collection of horizontal spines. In one preferred embodiment there are 16 horizontal spines in each collection. For simplification, FIG. 8 shows fully only one of one collection of horizontal spines off of only two possible vertical spines. The Vertical and collections of horizontal spines are represented by the vertical and horizontal lines 16, shown in FIG. 1. Each buffer 81 off the Vertical spines can be selectively connected to one of the collection of horizontal spines by the selective placement of a via in one of the available via locations 82. Preferably, such vias are on the via layer used to configure the logic array. Each horizontal spine consists of buffers 84, a trim circuit 86, via locations to route around or connect to the trim circuit 87, distribution buffers 85 and via locations 88 to connect a horizontal spine clock to one of two clocks on one block of logic cells 88 in the logic array. Preferably such via locations are on the via layer used to configure the logic array. Each enable buffer as shown in FIG. 9, further comprises via locations 96 to selectively connect one or more flip-flops 90 into the input of a latch 91, all of which are gated by the clock 92, the output of which gates 94 the clock 92. Preferably such via locations are also on the via layer used to configure the logic array. The flip-flops 90 delay a user enable signal to gate the clock 92. The latch insures the enable signal does not glitch the clock. User-definable set and bypass signals 95, allow the user to override the enable logic.

In this fashion, preferably any one of 32 clocks can drive the flip-flops 22 shown in FIG. 2, of any group of 256 logic cells. Such a group can be seen in FIG. 12.

Figure 10:
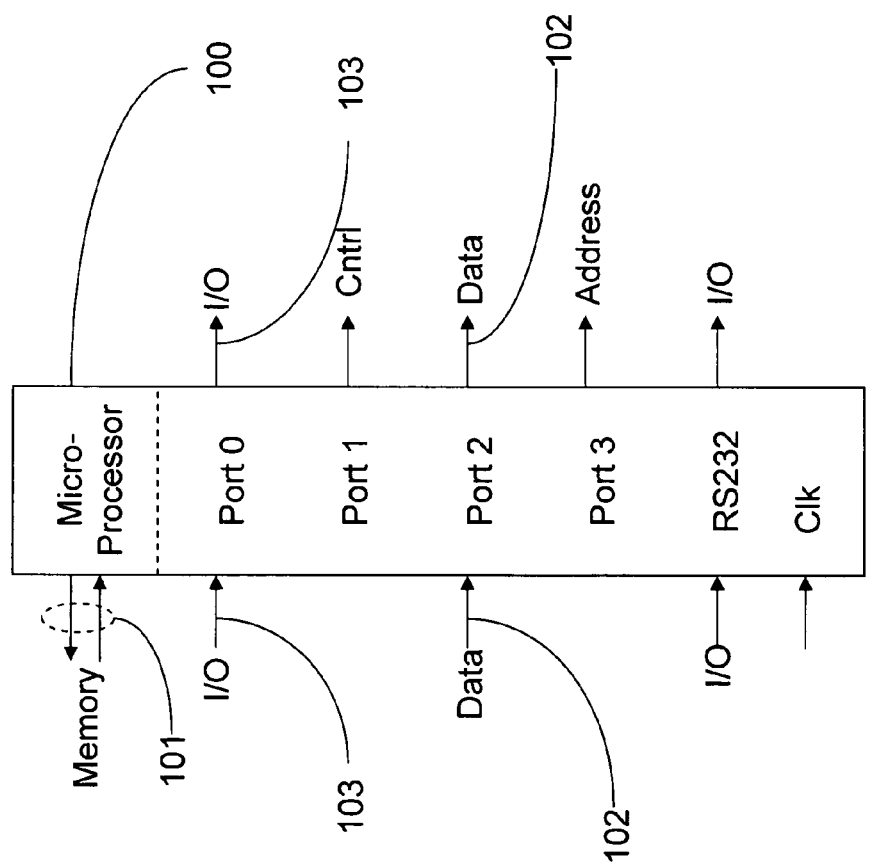
FIG. 10 is a block diagram of connections between a built-in microprocessor and other devices.
Figure 11:
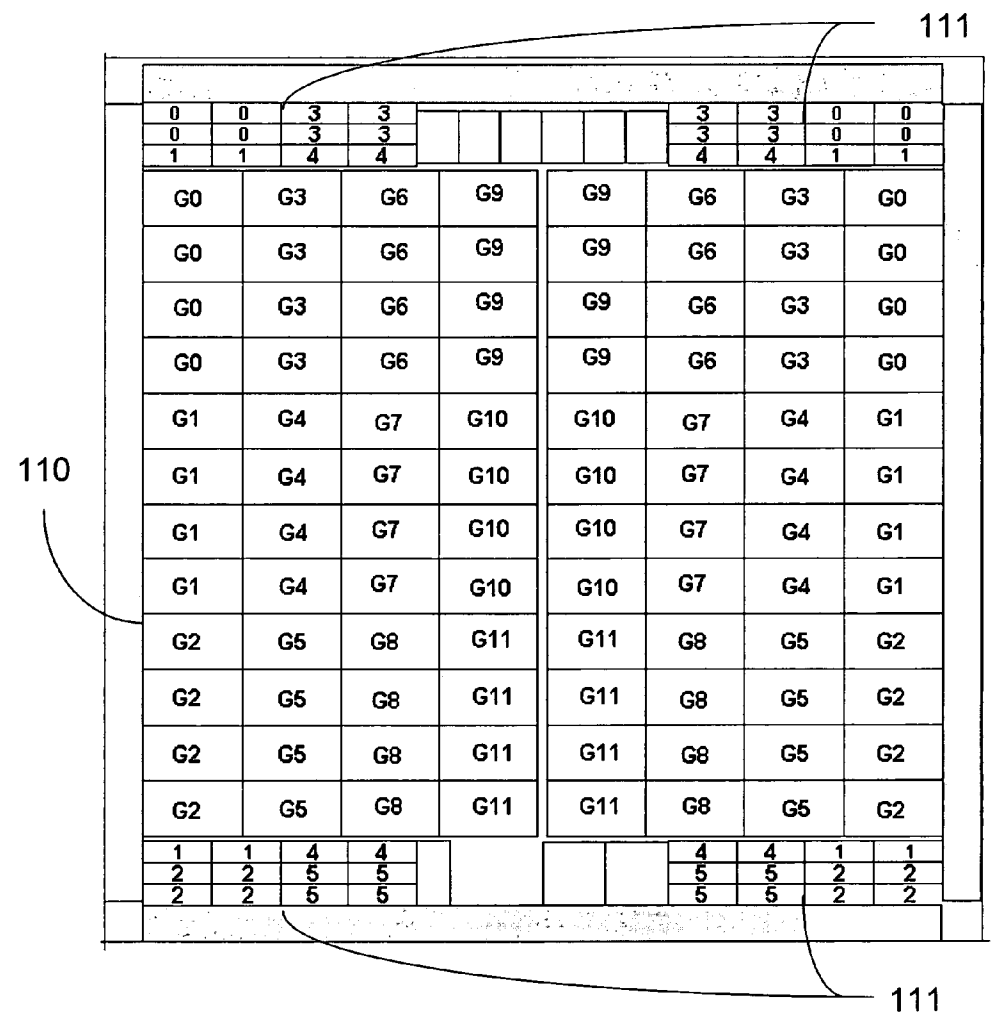
Figure 12:
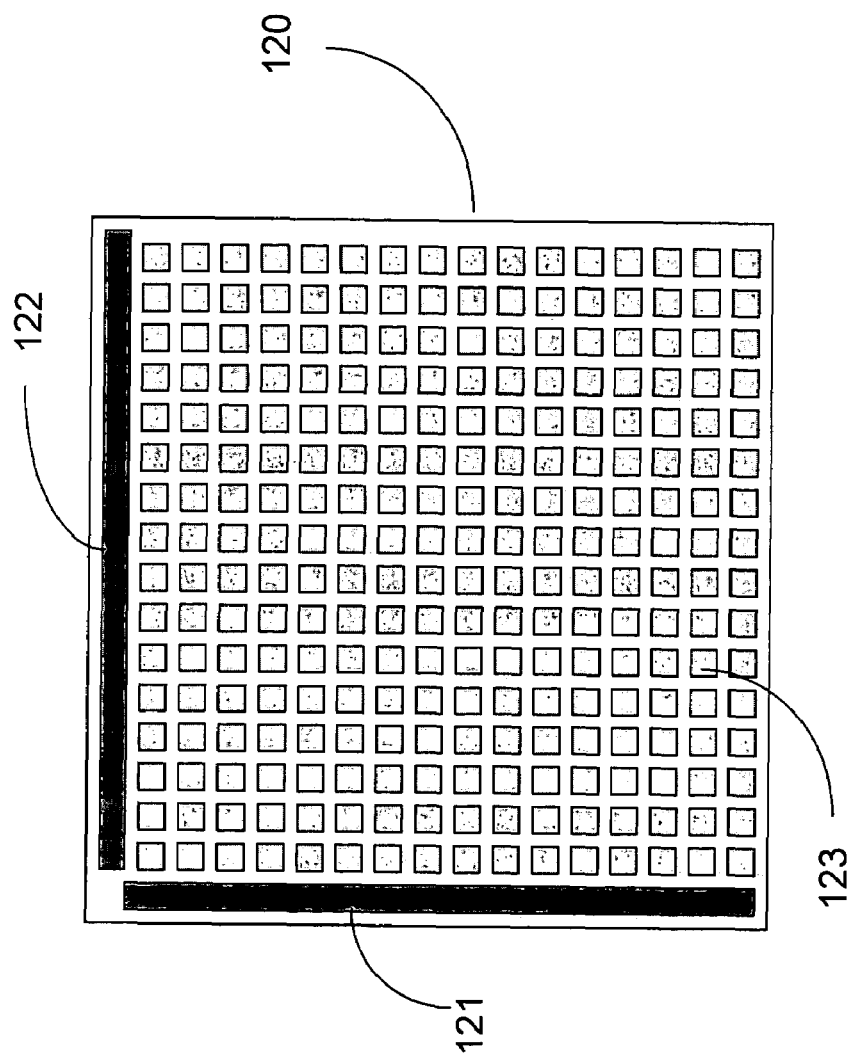
FIG. 12 is an illustration of the addressing of a multiplicity of Look Up Tables within a multiplicity of logic cells within a block as illustrated in FIG. 10.

Reference is now made to FIG. 10, which shows the I/O to and from the microprocessor 17, shown in FIG. 1. In one embodiment the processor is an 8051, with four I/O ports, and an RS232 serial port. As the diagram shows the input and output from port0 103 is dedicated to user defined communication. Selected via locations between a metal line from this port and the metal segments within the logic array (not shown), allows use of the Microprocessor 100 during normal operation of the Integrated circuit (IC). Port 1 is connected to control signals necessary put the IC into various modes of operation, such as normal operation, scan test, LUT and Memory access, and reset. Preferably these control signals also include controls to set the PLL clocks by selecting between reference clock frequencies and phases in a glitch free manner. The input and output on port 2 102 are dedicated to the transfer of data between processor, LUTs within the logic cells and RAM blocks on the IC. In one embodiment the RAM blocks contain a separate non-configurable port connected to the lines 102 from and to port 2, for observing and loading their contents separate from the RAM's usage by the user configuration. Port 3 is used to supply the address for reading or writing the LUT. The RS232 port is connected directly to I/O pins for debug access to the Microprocessor and the rest of the IC. The Microprocessor can either address external memory or the internal ROM block via the memory port 101. Control and address logic is included in the IC, connected to Port 1 and Port 3 of the microprocessor, to address the logic array and RAM blocks. FIG. 11 shows the addresses of blocks of logic cells 110 in the logic array, and RAM blocks 111 within the IC. All the flip-flops within the logic cells in each block can be accessed by scanning the data in and out through the data port 102 sshown in FIG. 10. As shown in FIG. 12, within each block of logic cells 120, which consists of 256 logic cells 123, there is address 121 and buffer logic 122 to access all the logic cells as if they are one contiguous memory.

In this fashion, a stream of external data may be loaded into the microprocessor for transfer into the RAM blocks and LUTs within the logic cells, and data may be scanned into the Flip-flops within the logic cells to completely configure the IC to begin performing a particular task. In one embodiment a different configuration of logic, more suitable for testing may be loaded into the LUTs, and patterns may be scanned into each of the strings of flip-flops such that normal scan based ATPG vectors may be loaded via the RS232 port into the IC and results may be serially sent out through the R232 port. Furthermore, the results may be combined into a checksum or signature by the microprocessor. In yet another embodiment a standard configuration for testing the IC may be set into the ROM block 14 by setting vias in the proper via locations such that upon power-up of the IC, the microprocessor reads the configuration data from the ROM, loads the test configuration data into the LUTs and RAM Blocks, and repeatedly; generates pseudo-random scan bit values, loads them into the scan strings of flip-flops, clocks the logic array, scans out the contents of the flip-flops adding the results to a signature, for a prescribed number of cycles, and then compares the resulting signature to a signature stored in ROM memory. In this fashion, the chip can perform a complete bring-up test without any external data. Upon determining the computed checksum is correct, the microprocessor can begin loading the external user configuration data.

Figure 13:
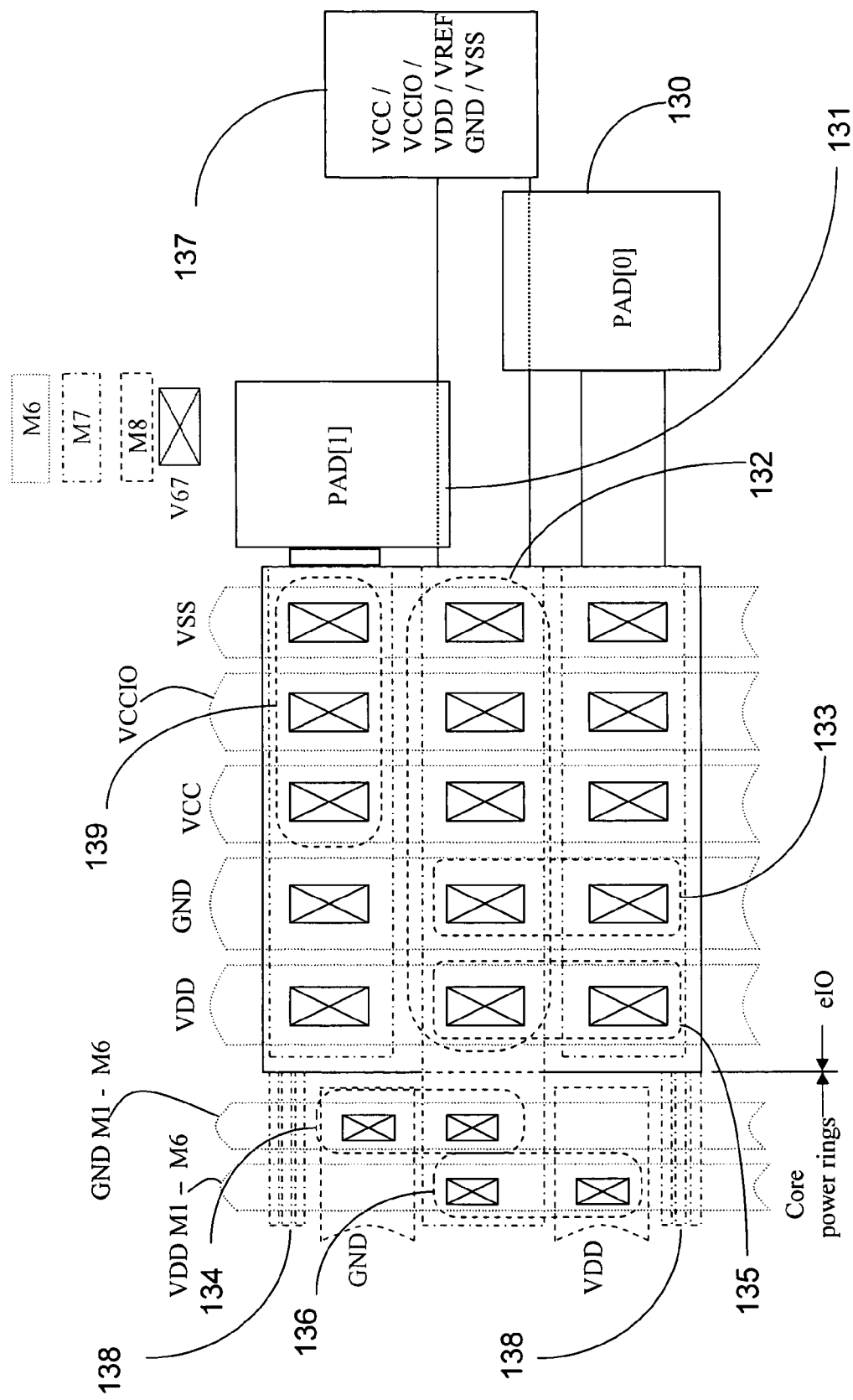
FIG. 13 is an illustration of Pads with dedicated P/G on the outer row.

Reference is now made to FIG. 13, a sideways illustration of Pad layouts with dedicated P/G on the outer row. There are three rows of pads, two signal pads 130 and 131, and a pad dedicated to Power or ground only 138. The signal pads can each connect to an I/O cell through wire 138. FIG. 4 also shows the signal pads 47. In FIG. 13, one or more selective via locations 132 may be filled with vias to connect the dedicated power/ground pad 137 to one or more internal and I/O power supply lines. If the dedicated power/ground pad 138 is used for internal power or ground, vias may be filled to either connect the pad 138 to internal ground 134 or internal power 136. Any signal pad can be used as an I/O power or ground pad. For example the inner signal pad 131 may be connected to the I/O power or ground by placing a via in the proper location 139. Furthermore, if the dedicated power/ground pad is unused, one of the signal pads may be used as internal power or ground. For example the outer signal pad 130 can be connected to the unused third pad by filling a pair of via locations through power 135 or ground 133, and then the unused power/ground pad can be connected by filling another pair of via locations to internal power 134 or ground 136. In a preferred embodiment the via locations are preferably on the same via layer as the via locations for the logic array.

Figure 14:
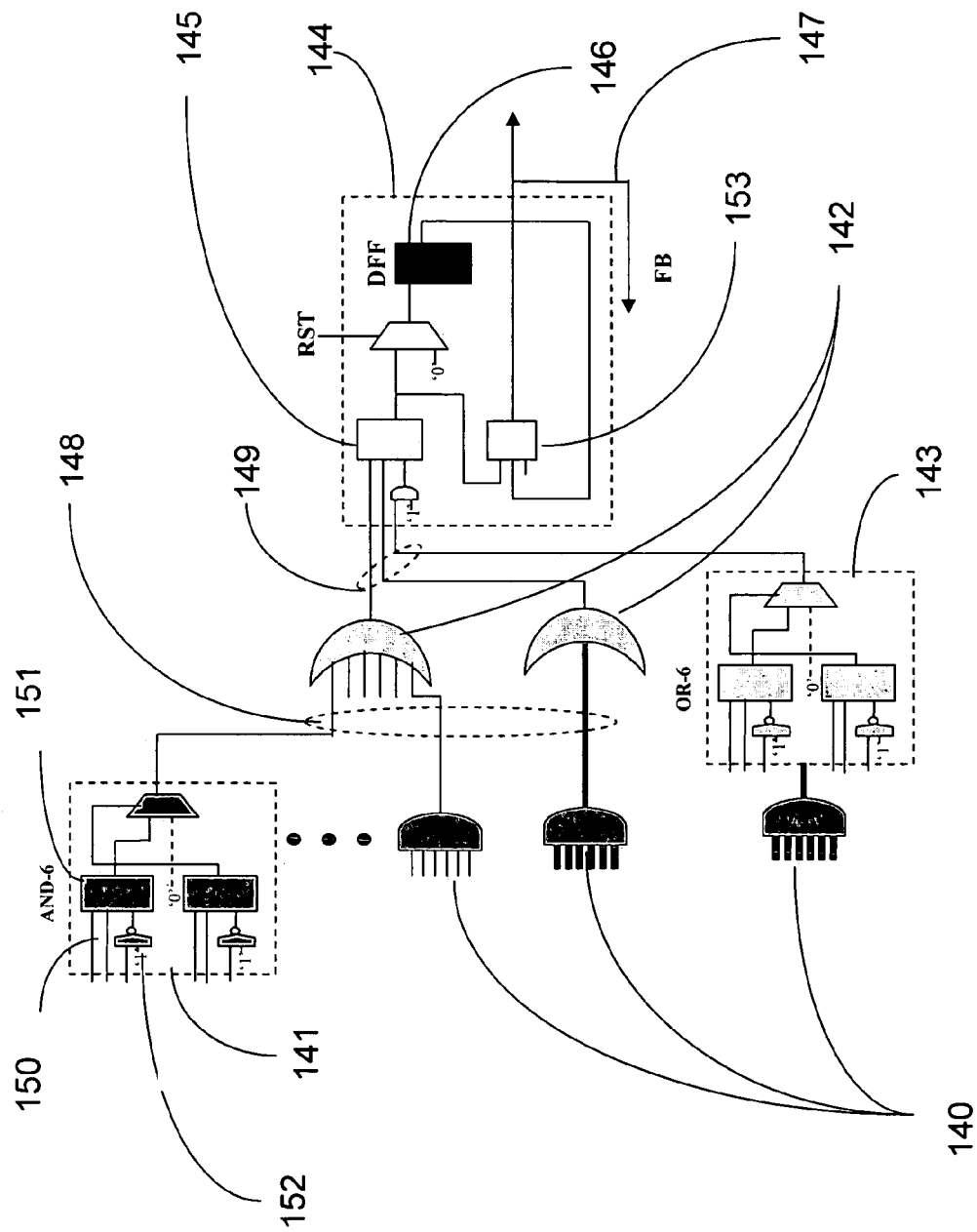
FIG. 14 is an illustration of one output of a soft programmable PLD structure comprised of logic cells.

Reference is now made to FIG. 14, an illustration of one output of a soft programmable PLD structure comprised of logic cells. Typically a PLD is comprised of a set of inputs that selectively connect into multiple AND functions, whose outputs connect into an OR function for each output which is registered before optionally feeding back into one or more of the AND functions. Which inputs are connected to which AND functions and which AND functions connect to the OR function for each output is programmable by the user. FIG. 14 shows depicts a 6 input 18 term single output PLA. Each AND function 140 is mapped into a single logic cell by setting vias at the proper via locations to configure both LUTs into a single AND function. The output of each AND function is routed 148 by properly selecting vias to connect metal segments between the AND functions and inputs to the OR function. The OR function 142 for each output is comprised of logic cells configured into an OR function 143, which are further connected through a routing of metal segments and selected vias 149, to the inputs of another logic cell 144 which is configured to OR 145 the inputs and optionally register 146 the result by selecting between the OR term or the register output in the other LUT 153, whose output is fed back by connecting other metal segments with selected vias 147 to one of the inputs. In this manner a PLD is constructed out of logic cells and metal interconnect, by selecting the proper via locations to fill on the preferred via layer.

To program the PLD, any input may be disconnected from any one of the AND terms by selectively changing the contents of the respective LUT. Furthermore, any of the AND terms may be disconnected from the OR term by changing the contents of the respective LUT. For example, the first pin 150 of the logic cell 141 containing an AND function can be eliminated by the user by changing the LUT's 151 contents from: 0, 0, 0, 1, 0, 0, 0, 0 to 0, 0, 1, 1, 0, 0, 0, 0. Since the pin 150 is connected to Address 0 of the LUT 151 and the nand gate 152 is on Address 2, a normal AND function: 0, 0, 0, 0, 0, 0, 0, 1 is converted (because the NAND function acts as an inverter) to 0, 0, 0, 1, 0, 0, 0, 0. By adding the additional 1, address 0 no longer affects the output. Similarly, OR inputs can be eliminated, and either the last OR term 145 or the register 146 output can be selected.

In yet another preferred embodiment, the preferred via layer, which configures the ROM, RAM, and I/O within the integrated circuit device are fabricated by direct wafer exposure from electronic data containing the locations of the vias to be created on the via layer. Typically the processing would be as follows:

1. Process all the semiconductor devices with traditional mask lithography, from the beginning of the process through device and metal layers up to the preferred via layer.
2. Hold the wafers before this layer.
3. When enough product has been ordered for each wafer, select which customer designs to expose, load them electronically into the direct wafer exposure equipment, along with a map of the wafer.
4. Expose the wafer by applying the custom via for each customer design on the site determined by the map of the wafer.
5. Process the wafers with the customized via exposures.
6. Process wafers with standard mask lithography for the rest of the metal layers.
7. Test the wafer, electronically load the specific customized test pattern for the design, at the site being probed.
8. Dice, sort and package the parts based on their packaging requirements.

9. Perform package test, again electronically loading the specific customized test pattern for the specific part's design, and sort the parts that pass.

Figure 15:
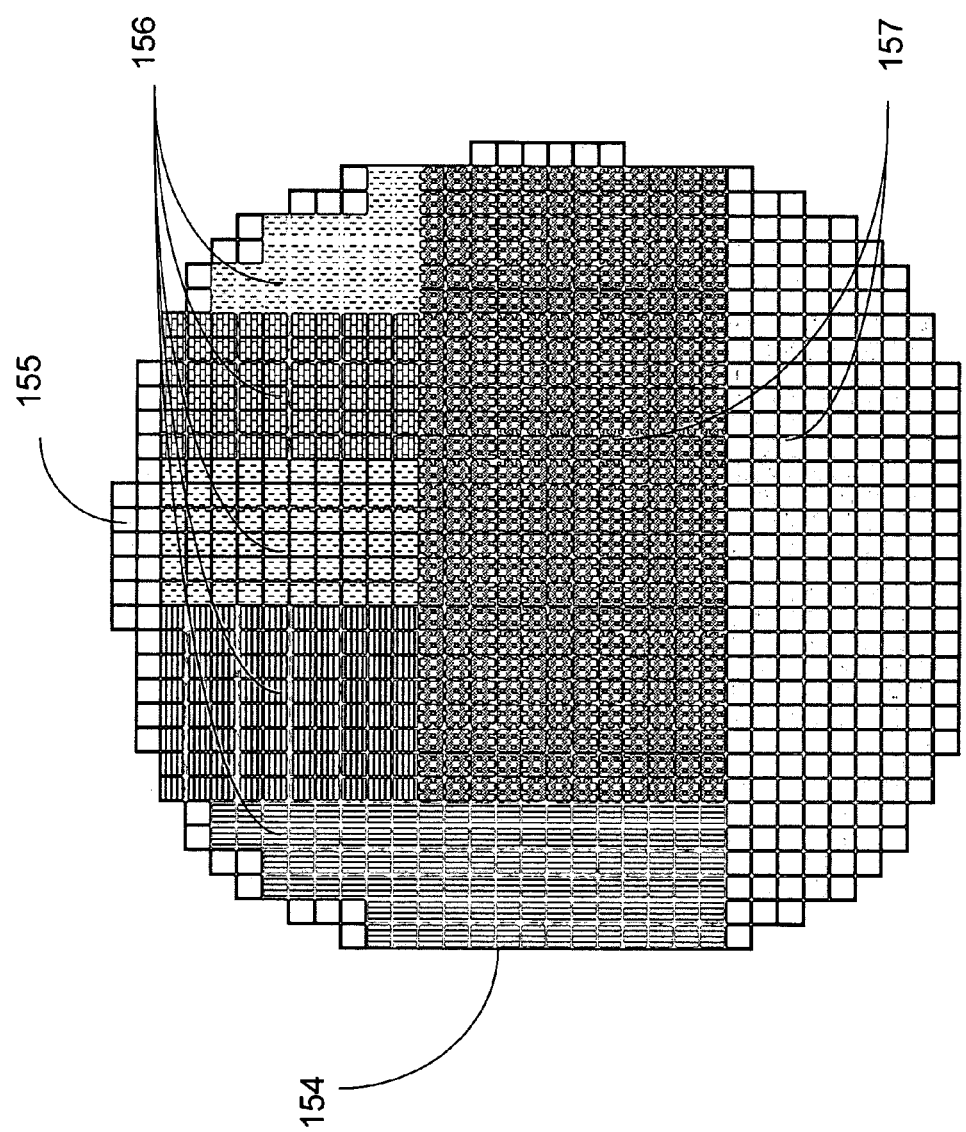
FIG. 15 is an illustration of a wafer map for customizing multiple designs on one wafer.

FIG. 15 is an illustration of the wafer map mentioned in step 3 above. The wafer map 154, contains sites for each die location 155, shaded by the customer designs to be placed at that site. Some designs are placed at a limited number of sites 156, to obtain, after processing, at least prototype quantities (~10) of good chips. Other designs 157 are added to the wafer for pre-production quantities (~100s) of chips are needed. Preferably the custom via layer is as near the end of the processing as possible to provide the required customization. This technique allows a continuous flow production facility to produce custom parts in varying quantities with reasonably short manufacturing time for the customization portion of the manufacturing (steps 4 through 9).

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

We claim:

1. A semiconductor device comprising:
a logic array, said logic array including a multiplicity of logic cells, each logic cell comprising at least one look-up table, said logic array further including metal and via connection layers overlying the multiplicity of logic cells to provide at least one permanent customized interconnect between various inputs and outputs thereof, wherein said customized interconnect is customized by a custom via layer; and
a multiplicity of device-customized I/O cells, wherein said device-customized I/O cells are customized by directly connecting at least two of a multiplicity of devices within each I/O cell using said custom via layer.

2. A semiconductor device according to claim 1, also comprising at least one contiguous configurable RAM block, and wherein said RAM block input and output configuration is customized by said custom via layer.

3. A semiconductor device according to claim 1, also comprising a configurable ROM block, and wherein each bit of said ROM block content is to be customized by a single via on said custom via layer.

4. A semiconductor device according to claim 1, also comprising a customizable clock distribution structure, wherein said customizable clock distribution structure is to be customized by selectively connecting components of said clock distribution structure using said custom via layer.

5. A semiconductor device comprising:
a logic array comprising a multiplicity of logic cells, each logic cell including at least one flip-flop, and at least one metal connection layer overlying the multiplicity of identical logic cells to provide at least one permanent customized interconnect between various inputs and outputs thereof, wherein said customized interconnect is customized by a custom via layer; and
a multiplicity of device-customized I/O cells, wherein said device-customized I/O cells are customized by directly connecting at least two of a multiplicity of devices within each I/O cell using said custom via layer.

6. A semiconductor device according to claim 5, also comprising a contiguous configurable RAM block, wherein an input/output configuration of said RAM block is to be customized by said custom via layer.

7. A semiconductor device according to claim 6, also comprising a built-in microprocessor, wherein said configurable RAM block has a configurable read/write port, and wherein said built-in microprocessor has the ability to access said RAM block through a separate read/write port from the configurable RAM read/write port.

8. A semiconductor device according to claim 5, also comprising a configurable ROM block, wherein each bit of said configurable ROM block is to be customized by a single via on said custom via layer.

9. A semiconductor device according to claim 5, also comprising a customizable clock distribution structure, wherein said customizable clock distribution structure is to be customized by selectively connecting components of said clock distribution structure using said custom via layer.

10. A logic array comprising:
a multiplicity of identical logic cells, each identical logic cell comprising at least one look-up table;
metal connection layers overlying the multiplicity of identical logic cells; and
a single customizable via layer to provide at least one permanent customized direct interconnect between various inputs and outputs of the multiplicity of identical logic cells,
wherein said logic array is customized such that the functionality of said multiplicity of identical logic cells is selected from one of a number of functions, each said function determined by a different configuration of at least one of said look-up tables.

11. A semiconductor device comprising:
a multiplicity of functional blocks, including at least one contiguous configurable RAM block, wherein an input/output configuration of at least one said RAM block is customized by a custom via layer; and
a multiplicity of metal connection layers overlying said multiplicity of functional blocks to provide at least one permanent customized interconnect between various inputs and outputs of said multiplicity of functional blocks, wherein said customized interconnect is to be customized by said custom via layer.

12. A semiconductor device according to claim 11, wherein said custom via layer is produced by wafer exposure directly from electronic data of said custom via layer.

13. A semiconductor device comprising:
a multiplicity of functional blocks, including at least one configurable ROM block, wherein each bit of said ROM block is to be customized by a single via on a custom via layer; and
a multiplicity of metal connection layers overlying said multiplicity of blocks to provide at least one permanent customized interconnect between various inputs and outputs of said multiplicity of functional blocks, wherein said customized interconnect is customized by said custom via layer.

14. A semiconductor device according to claim 13, wherein said custom via layer is produced by wafer exposure directly from electronic data of said custom via layer.

15. A semiconductor device comprising:
a multiplicity of functional blocks;
a multiplicity of metal connection layers overlying said multiplicity of functional blocks to provide at least one permanent customized interconnect between various inputs and outputs of said multiplicity of blocks, wherein said customized interconnect is customized by a custom via layer; and
a multiplicity of device-customized I/O cells, wherein said device-customized I/O cells are customized by directly connecting at least two of a multiplicity of devices within each I/O cell together using said custom via layer.

16. A semiconductor device according to claim 15, wherein said custom via layer is produced by wafer exposure directly from electronic data of said custom via layer.

17. A semiconductor device comprising:

a multiplicity of functional blocks, including at least one configurable ROM block, wherein contents of said ROM block are to be customized by a custom via layer, and also including at least one contiguous configurable RAM block, wherein an input/output configuration of said RAM block is to be customized by said custom via layer;

a multiplicity of metal connection layers overlying said multiplicity of functional blocks to provide at least one permanent customized interconnect between various inputs and outputs of said multiplicity of blocks, wherein said customized interconnect is to be customized by said custom via layer;

and a multiplicity of device-customized I/O cells, wherein said customized I/O cells are to be customized by said custom via layer.

18. A semiconductor device according to claim 17, wherein said custom via layer is produced by wafer exposure directly from electronic data of said custom via layer.

19. A semiconductor device according to claim 1, wherein each said logic cell further includes a multiplexer with at least one input connected to at least one output of one of said look-up tables.

20. A semiconductor device according to claim 1, wherein each said logic cell further includes a NAND gate with at least one output connected to at least one input of one of said at least one look-up table.

21. A semiconductor device according to claim 1, wherein each said logic cell further includes a multiplicity of buffers, wherein at least one of said buffers of at least one of said logic cells is configured to be used independently of other logic in said at least one of said logic cells.

22. A semiconductor device according to claim 5, wherein each said logic cell further includes at least one look-up table and a multiplexer with at least one input connected to at least one output of one of said at least one look-up table.

23. A semiconductor device according to claim 5, wherein each said logic cell further includes at least one look-up table and a NAND gate with at least one output connected to at least one input of one of said at least one look-up table.

24. A semiconductor device according to claim 5, wherein each said logic cell further includes a multiplicity of buffers, wherein at least one of said buffers of at least one of said logic cells is configured to be used independently of other logic in said at least one of said logic cells.

* * * * *